United States Patent [19]

Kim

[11] Patent Number: 6,098,826
[45] Date of Patent: Aug. 8, 2000

[54] COMMUNICATIONS EQUIPMENT HOUSING

[75] Inventor: Tae-Ryong Kim, Kumi, Rep. of Korea

[73] Assignee: SamSung Electronics Co., Ltd., Kyungki-do, Rep. of Korea

[21] Appl. No.: 09/106,100

[22] Filed: Jun. 29, 1998

[30] Foreign Application Priority Data

Jun. 28, 1997 [KR] Rep. of Korea .................. 97-28658

[51] Int. Cl.⁷ .................................................. B65D 6/00
[52] U.S. Cl. ..................... 220/4.02; 220/4.28; 220/668
[58] Field of Search ............................ 220/4.02, 4.26, 220/4.28, 4.31, 668, 682

[56] References Cited

U.S. PATENT DOCUMENTS

| | | |
|---|---|---|
| Re. 32,762 | 10/1988 | Katzmann et al. . |
| 3,999,676 | 12/1976 | Trebilcock et al. ................. 220/4.28 X |
| 4,089,464 | 5/1978 | Teti, Jr. et al. . |
| 4,090,632 | 5/1978 | Katzmann et al. . |
| 4,274,545 | 6/1981 | Peroni . |
| 4,471,898 | 9/1984 | Parker ................................ 220/4.02 X |
| 5,507,405 | 4/1996 | Thomas et al. .................... 220/4.28 X |
| 5,706,965 | 1/1998 | Honma et al. . |

*Primary Examiner*—Steven Pollard
*Attorney, Agent, or Firm*—Robert E. Bushnell, Esq.

[57] ABSTRACT

A communications equipment housing may be constructed using an upper plate, four vertical members extending downward from the four corners of the upper plate and attach to a lower plate. A front side plate and a rear side plate are attached to the sides of the housing and two lateral side plates are installed on the sides between the front side plate and the rear side plate. Both lateral sides are composed of two main lateral side plates and an auxiliary lateral side plate that is located between the two main lateral side plates. An female groove is formed along an edge of each main lateral side plate in a direction perpendicular to the planes of the top and bottom plates. The auxiliary lateral side plate has projecting male protrusions formed along two lateral edges of the auxiliary plate in a direction perpendicular to the planes of the top and bottom plate. A lateral side plate for the housing is assembled by tightly engaging the male protrusions of the auxiliary lateral side plate into the female grooves of the main lateral side plates. This allows for the simple adjustment of the housing to accommodate electronic components of greater number or size.

14 Claims, 7 Drawing Sheets

COMMUNICATIONS EQUIPMENT HOUSING

CLAIM OF PRIORITY

This application makes reference to, incorporates the same herein, and claims all rights accruing thereto under 35 U.S.C. § 119 through my patent application entitled Communications Equipment Rack earlier filed in the Korean Industrial Property Office on Jun. 28th, 1997 and there duly assigned Ser. No. 1997/28658.

BACKGROUND OF THE INVENTION

1. Field of the Invention

The present invention relates to a communications equipment housing and, more specifically, to a communications equipment housing having lateral side plates that allow for a more standardized manufacturing process.

2. Background Art

In general, a housing is used to protect various interior circuit components of communications equipment such as a switch, a transmission device, a cordless communications device. Such a housing is formed of a solid metal, and includes a plurality of plates and vertical members.

A housing for communications equipment may be constructed using an upper plate, four vertical members extending downward from the four corners of the upper plate, a lower plate that is attached to the vertical members, a front side plate and a rear side plate that are attached on the sides of the housing between the upper and lower plates, and side lateral plates that are positioned on the sides of the housing between the front side plate and the rear side plate.

The connection of a lateral side plate to the housing may be accomplished using a side support that has one end connected to an interior side of a vertical member, that bears any vertical loads, via a clamping bolt, and the other end of the side support is connected to a lateral side plate by another clamping bolt that is inserted through a clamping hole that is positioned on the lateral side plate.

These sort of lateral side plates in communications equipment housing require that different lateral side plates be made for each size chassis. This occupies manufacturing resources and prevents the streamlining and the standardization of the manufacturing process. In addition, because the dimensions of the lateral side plates are designed early in the manufacturing process, a manufacturer cannot easily adjust the width of the lateral side plates to accommodate variations in the dimensions or number of interior circuit components that are to be contained in the housing.

As such, I believe it may be possible to improve on the contemporary art by providing a communications equipment housing that is easier to standardize the manufacturing process of, that is simpler to assemble than contemporary housings, that has lateral side plates that are adjustable during the manufacturing process to accommodate varying types and variously sized electronic equipment.

SUMMARY OF THE INVENTION

Accordingly, it is an object of the present invention to provide an improved housing for communications equipment.

It is another object to provide a housing for communications equipment that does not require that separate complete lateral side plates be manufactured for each differently sized housing during the manufacturing process.

It is still another object to provide a housing for communications equipment that is simpler to assemble than contemporary housings.

It is yet another object to provide a housing for communications equipment that has lateral side plates that are adjustable during the manufacturing process to accommodate various sizes and numbers of electronic components, thus allowing greater standardization of components that are used in the manufacturing process. As such, the same main lateral side plates can be used equipment housings of various sizes, while only needing to change the particular auxiliary lateral side plate used.

To achieve these and other objects, a communications equipment housing is provided that may be constructed using an upper plate, four vertical members extending downward from the four corners of the upper plate and attach to a lower plate. A front side plate and a rear side plate are attached to the sides of the housing and two lateral side plates are installed on the sides between the front side plate and the rear side plate. Each lateral side plate is composed of two main lateral side plates and an auxiliary lateral side plate that is located between the two main lateral side plates. A female groove, or female connector, is formed along an edge of each main lateral side plate in a direction perpendicular to the planes of the top and bottom plates. The auxiliary lateral side plate has projecting male protrusions formed along two lateral edges of the auxiliary plate in a direction perpendicular to the planes of the top and bottom plate. A lateral side plate for the housing is assembled by tightly engaging the male protrusions of the auxiliary lateral side plate into the female grooves of the main lateral side plates. This allows for the greater standardization of the components used during the manufacturing of equipment housings. Since the main lateral side plates can be used for various housings and only the auxiliary lateral side plates need to be changed to manufacture a housing of a different dimension.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE DRAWINGS

Figure 1:
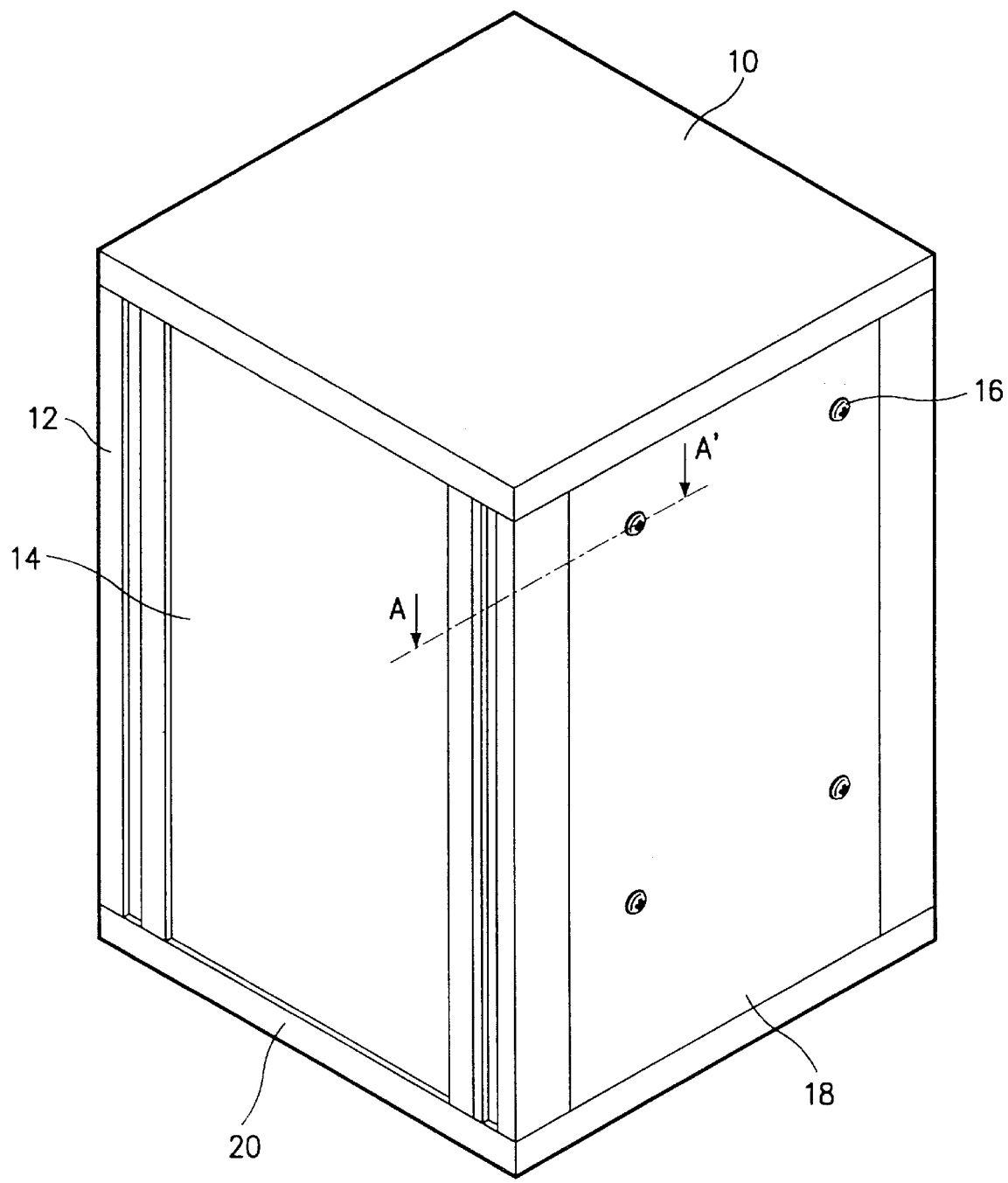
FIG. 1 is a perspective view of a communications equipment housing.

Turning now to the drawings, FIG. 1 illustrates a housing for communications equipment. A communications equipment housing may be constructed using upper plate 10 and four vertical members 12 that extending downward from the four corners of upper plate 10. Lower plate 20 is attached beneath vertical members 12 and both front side plate 14 and rear side plate (not shown) are located on opposing sides of the housing between the upper and the lower plates. Lateral side plates 18 are located on opposing sides of the housing between front side plate 14 and the rear side plate.

Figure 2:
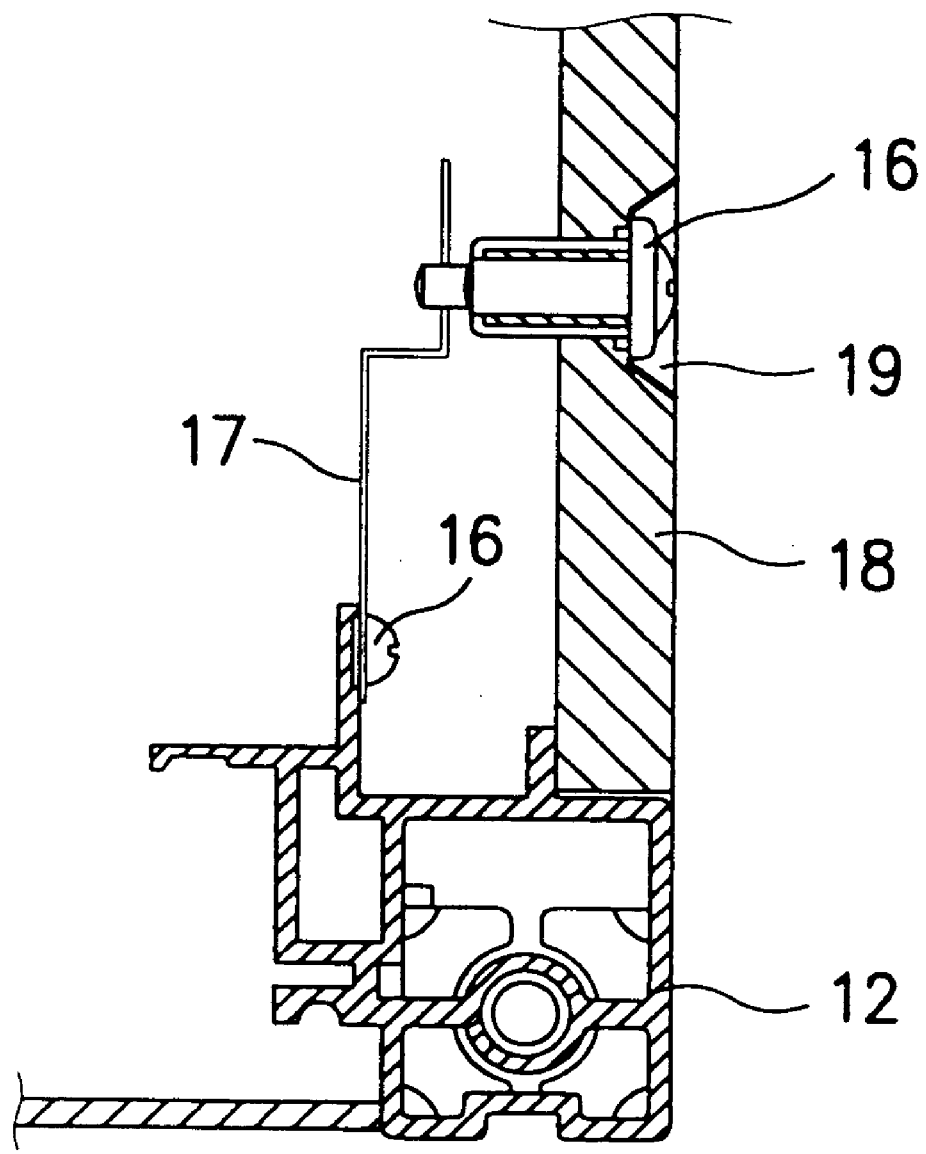
FIG. 2 is a cross-sectional view of the communications equipment housing of FIG. 1, taken along the line A–A'.

FIG. 2 is a cross-sectional of the housing in FIG. 1 as taken along the line A–A' that illustrates the type of connection used to attach lateral side plate 18 to the housing. Side support 17 has one end connected, via a clamping bolt, to an inner surface of vertical member 12 that bears vertical loads. A second end of side support 17 is connected to lateral side plate 18 by another clamping bolt 16 that is inserted through clamping hole 19 that is formed in lateral side plate 18.

Figure 3:
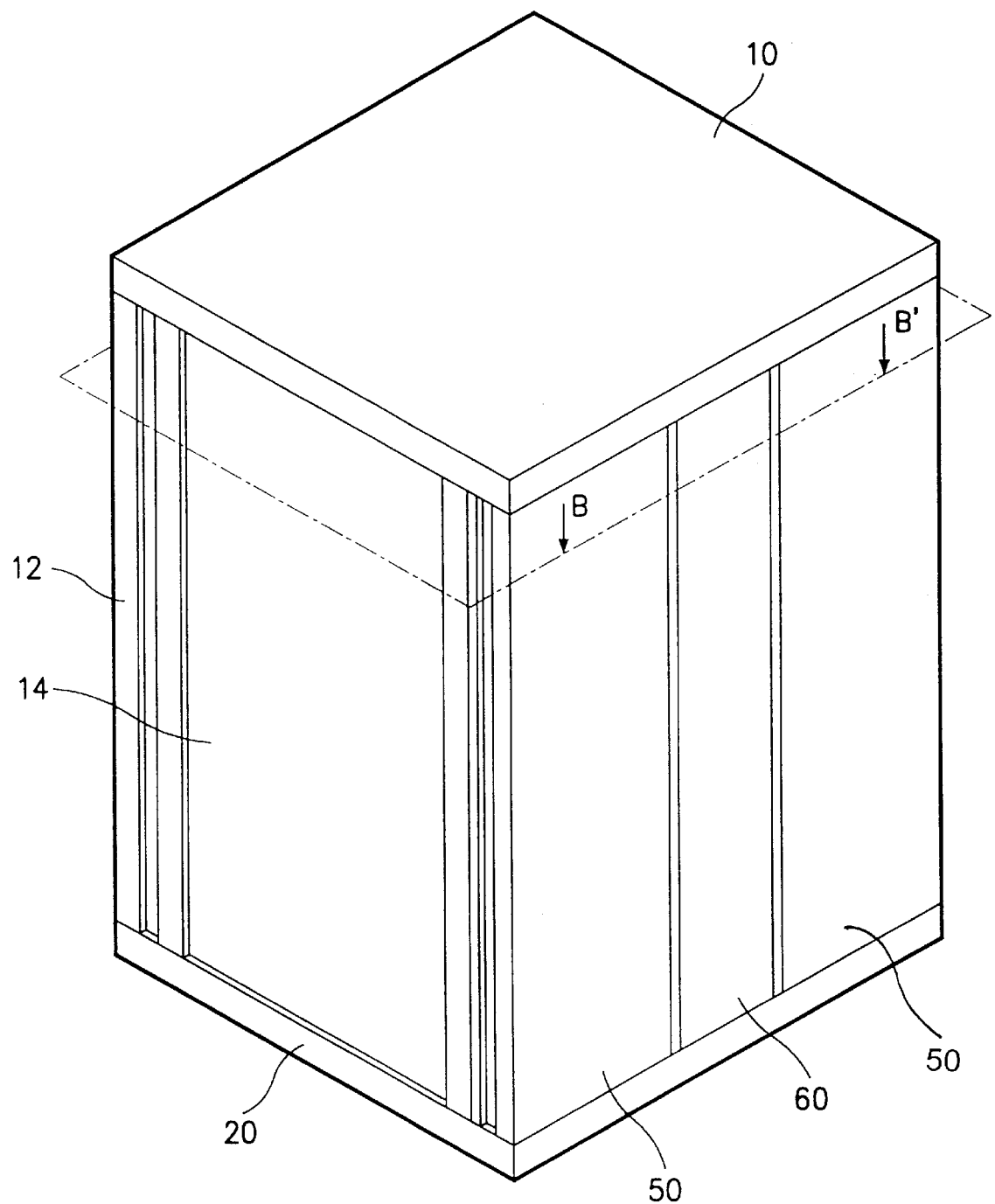
FIG. 3 is a perspective view of a communications equipment housing as constructed according to the principles of the present invention.
Figure 4:
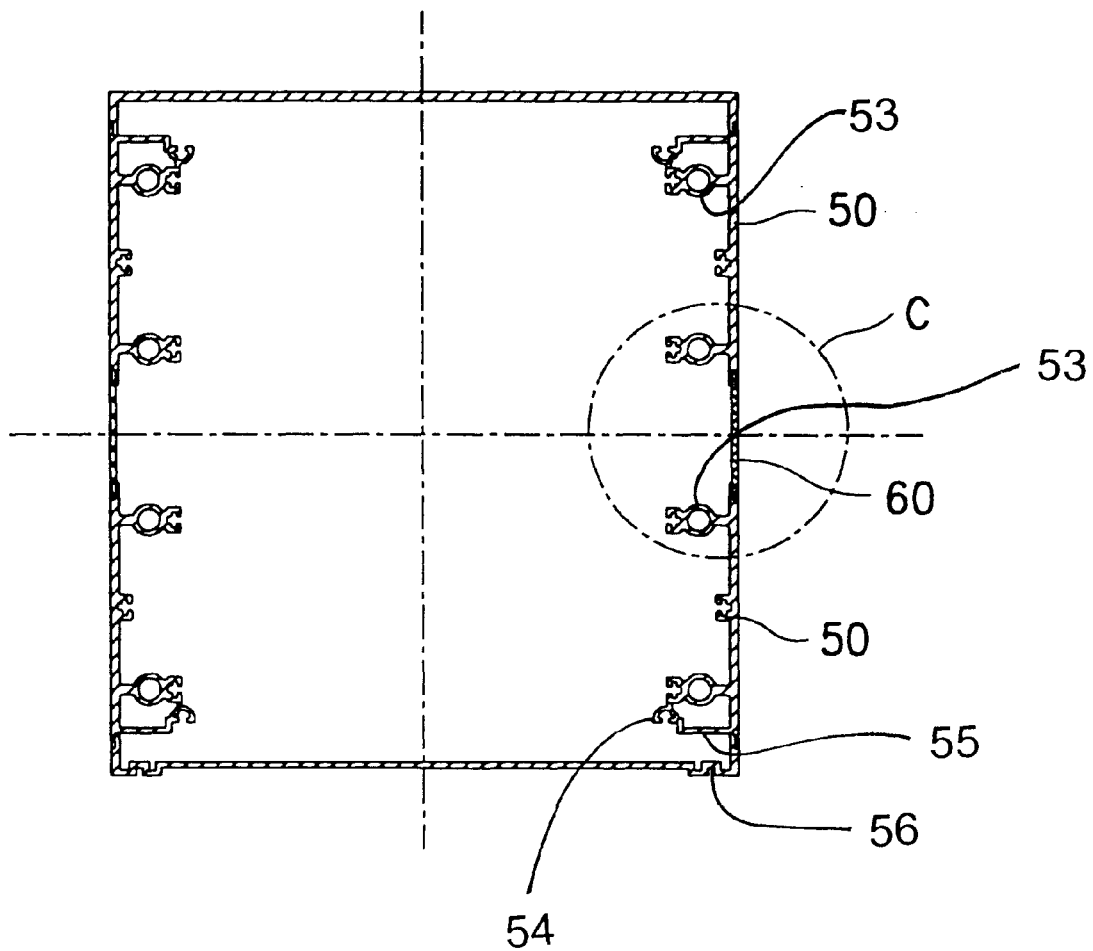
FIG. 4 is a cross-sectional view of FIG. 3, taken along the plane B–B'.

A perspective view of a communications equipment housing as constructed according to the principles of the present invention is shown in FIG. 3. The housing has a substantially rectangular prism shape. Upper plate 10 forms the top side of the housing and has four vertical members (not shown) attached to one side and extending downward. Bottom plate 20 forms the bottom side, or base, of the housing. Attached in between the upper plate and the lower plate is front side plate 14 and rear side plate (not shown). Each of the two auxiliary lateral side plates is constructed using two main side plates 50 and auxiliary lateral side plate 60. The use of the auxiliary side plate allows for further standardization of the manufacturing process and makes it easier to manufacture housings of different sizes. FIG. 4 illustrates a cross-sectional view of the housing of FIG. 3 along the line B–B'. Connectors 53 are used to attach various electronic equipment to the housing. Surface 55 of the main lateral side plates and surface 56 of the front side plate and rear side plate can be braced against a vertical member (not shown).

Figure 5:
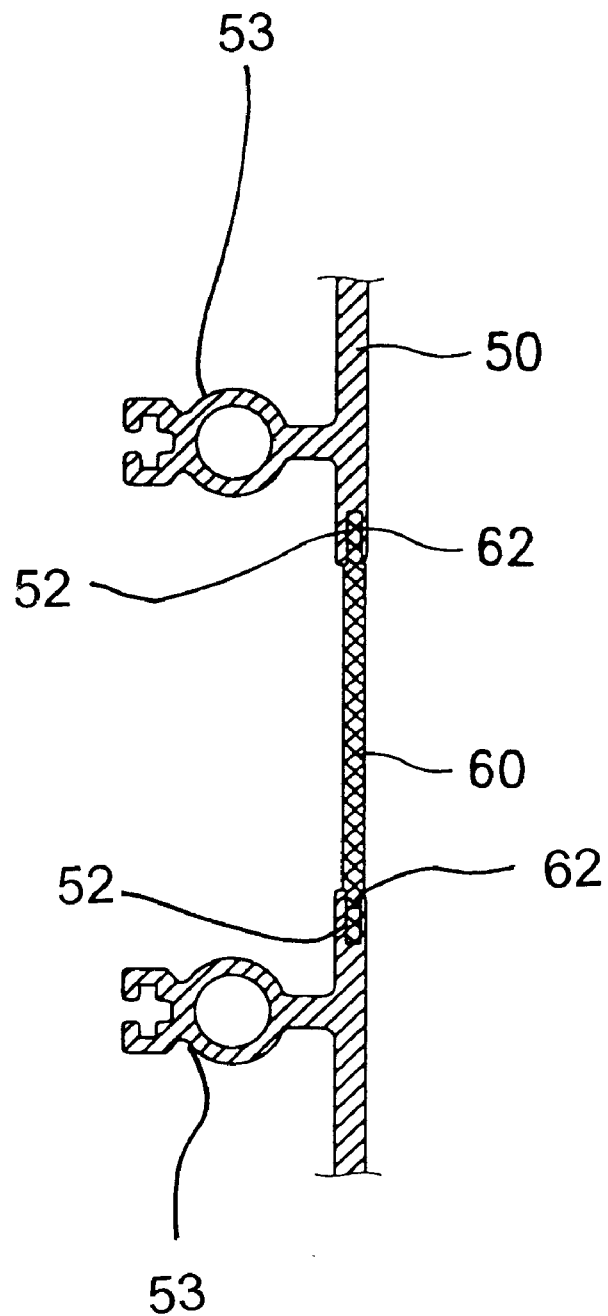
FIG. 5 is an enlarged view of the portion of FIG. 4 denoted 'C'.
Figure 6:
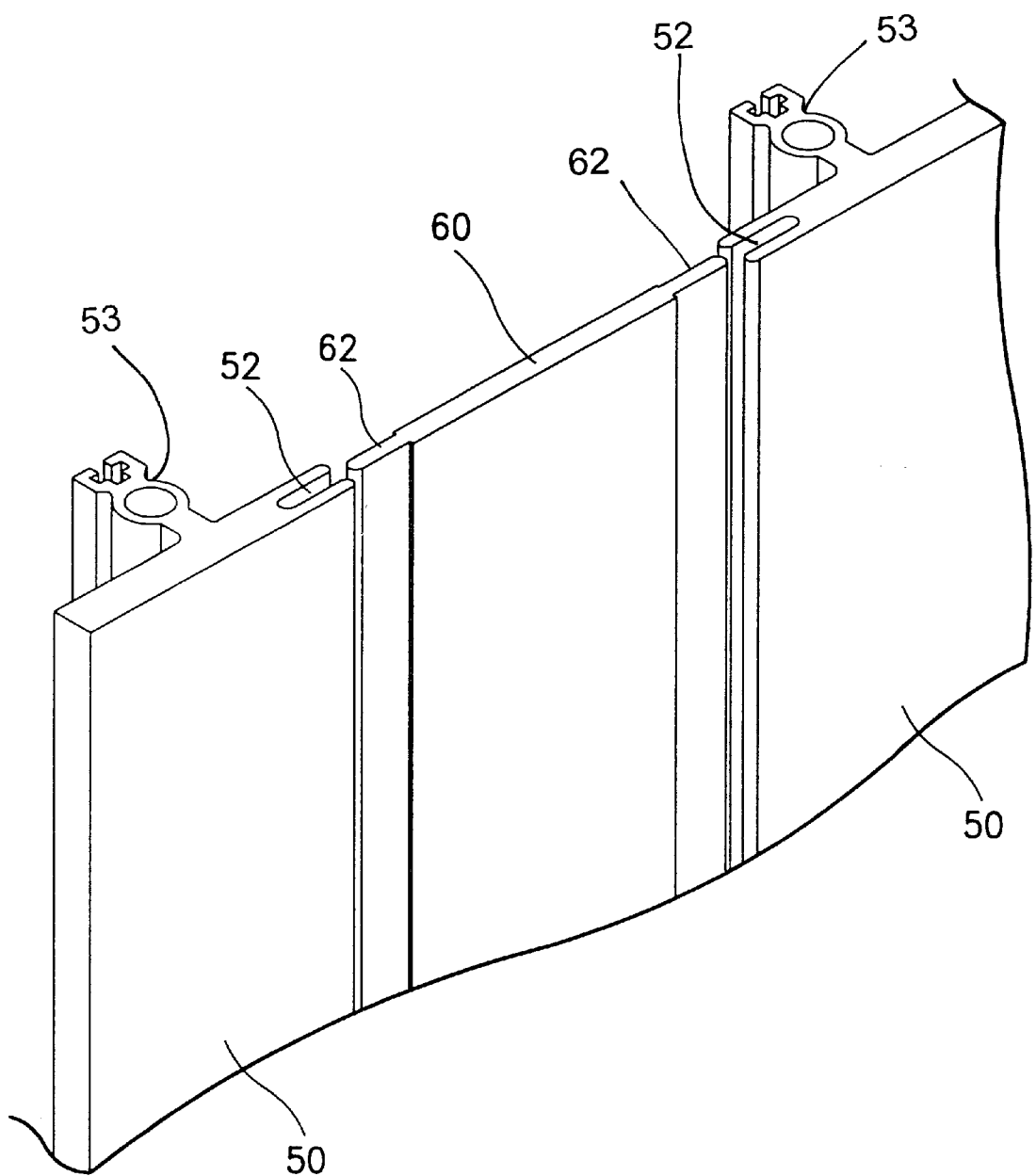
FIG. 6 is a perspective view of FIG. 5.

FIG. 5 illustrates the area contained in the circle denoted 'C' in FIG. 4. Auxiliary plate 60 has male connectors 62 located along two edges to facilitate engaging the two main lateral side plates. The male connectors 62 are centrally located along the edge and spaced apart from the front and rear faces of the auxiliary plate. FIG. 6 shows a perspective view of both male connector 62, positioned along two edges of the auxiliary plate, and female connectors 52 located along one edge of each main lateral side plate. The female connectors 52 are centrally located along the edge and spaced apart from the front and rear faces of the main lateral side plate. Female connector 52 may be formed as a concave slot and male connector 62 is a protrusion that engages the female connector. When engaged, the lateral side plate 50 is flush with the auxiliary plate 60. Male connectors, or protrusions, 62 of the auxiliary lateral side plate 60 are tightly fit into female connectors, or concave slots, 52 of the two main lateral side plates 50, as shown in FIGS. 3, 4, and 5. The length, width and thickness of the male connector correspond to the female connector cavity. Connectors 53 can be used to secure various electronic equipment to the sides of the housing.

Figure 7:
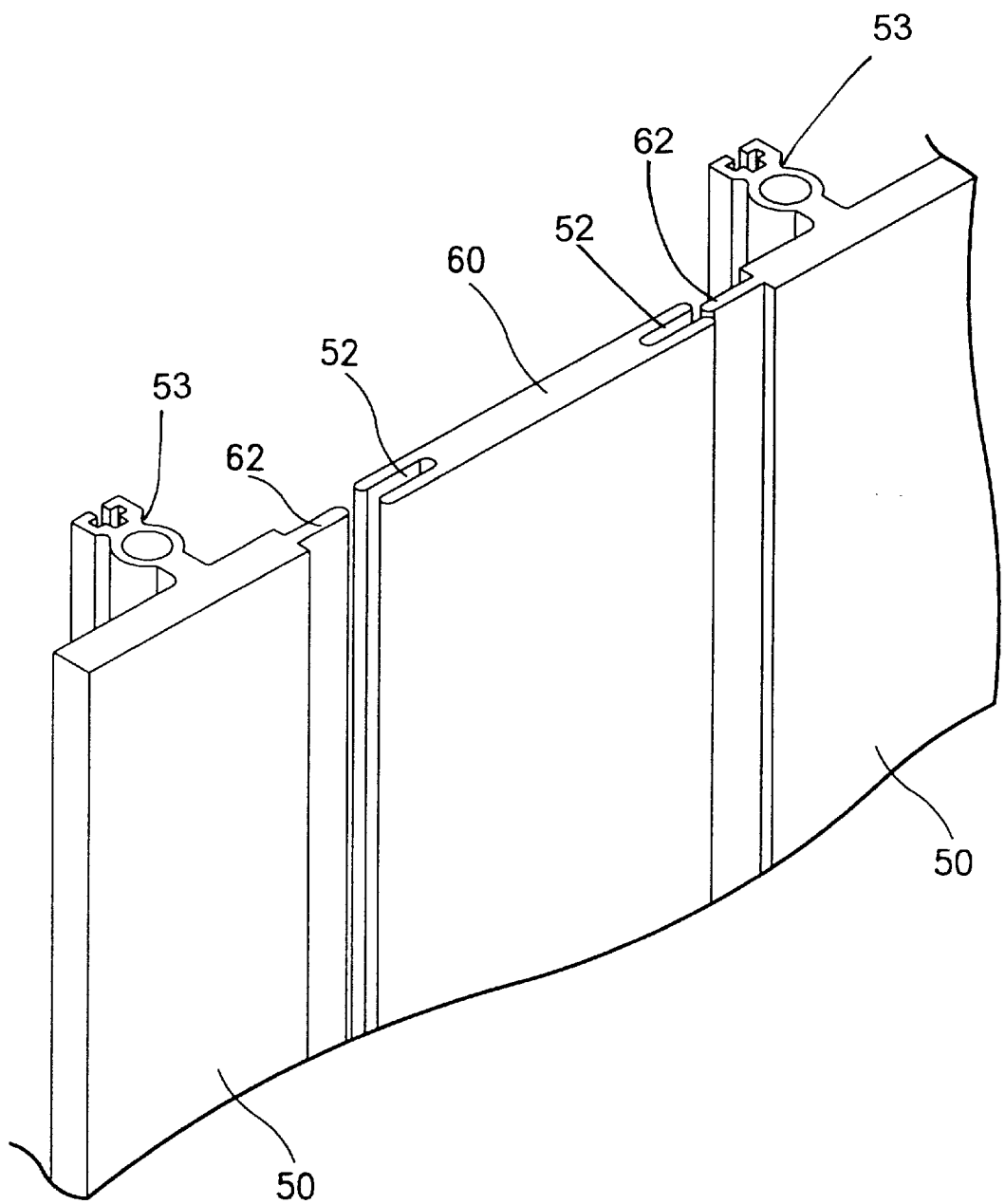
FIG. 7 is a partial perspective view of a lateral side plate in a communications equipment housing as constructed according to a second embodiment of the present invention.

A second embodiment of the present invention is illustrated in FIG. 7. Male connectors 62 protrude from one edge of each main lateral side plate 50 and are engageable with female connectors 52 that are formed along two edges of auxiliary lateral side plate 60.

As described above, the lateral side plates used in the communications equipment housing of the present invention is easier to standardize manufacturing processes for. When changing the dimensions of housings being manufactured, one need only manufacture different sized auxiliary lateral side plates. This allows all the housings to be produced more efficiently and simplifies the adjustment of a manufacturing line from making houses of a first size to making housings of a second size. Thus, the cost of the housings is reduced and the market competitiveness of the product is correspondingly increased.

Although this preferred embodiment of the present invention has been disclosed for illustrative purposes, those skilled in the art will appreciate that various modifications, additions and substitutions are possible, without departing from the scope and spirit of the invention as disclosed in the accompanying claims. It is also possible that other benefits or uses of the currently disclosed invention will become apparent over time.

What is claimed is:

1. A housing having a substantially rectangular prism shape and having a top side, a bottom side, a front side, a rear side and two lateral sides, said housing comprising:

an upper plate forming said top side;

a plurality of vertical members attached to said upper plate;

a lower plate attached to said vertical members for forming said bottom side;

a front side plate attached between said upper plate and said lower plate for forming said front side;

a rear side plate attached between said upper plate and said lower plate for forming said rear side; and both of said two lateral sides comprising:

two main lateral side plates each attached between said upper plate and said lower plate, each of said two main lateral plates being adjacent to different ones of said front side and said rear side of said housing, said two main lateral side plates each having a female connector extending along one entire edge of each one of said two main lateral side plates in a direction perpendicular to said upper plate and said lower plate, said female connector being centrally located along said entire edge and spaced apart from front and rear faces of said main lateral side plates;

said female connector having a rectangular shaped cavity tapered to a U-shaped end and two side walls of the female connector tapered to U-shaped ends;

an auxiliary lateral side plate positioned between said two main lateral side plates, said auxiliary lateral side plate having a male connector extending along two entire lateral edges in a direction perpendicular to said upper plate and said lower plate for retentively engaging said female connector in each of said two main lateral side plates, said male connector being centrally located along said entire edge and spaced apart from front and rear faces of said auxiliary side plate;

said male connector being rectangularly shaped with a U-shaped tapered end;

said male connector having a thickness less than said auxiliary plate; and a length, width and thickness of said male connector corresponding to the cavity of said female connector.

2. The housing of claim 1, further comprised of said housing supporting and enclosing a plurality of electronic equipment.

3. The housing of claim 1, further comprised of said female connector along one side of each of said two main lateral side plates being a concave slot.

4. The housing of claim 3, further comprised of said male connector along two edges of said auxiliary lateral plate being a protrusion for retentively engaging said concave slot of said two main lateral side plates.

5. The housing of claim 1, further comprised of said main lateral side plates connected to said vertical members using a side support having one end connected to an interior side of said vertical member using a fastening means, and the other end of said side support connected to said main lateral side plate using a fastening means positioned on said main lateral side plate.

6. The housing of claim 1, further comprised of said main lateral side plates each having equipment connectors integrally formed as a unitary piece comprised of a hollow tube connected vertically to said main lateral side plates and dual hooks facing each other in a U-shape connected to the hollow tube.

7. The housing of claim 1, said auxiliary lateral side plate flush with said two main lateral side plates.

8. A housing having a substantially rectangular prism shape and having a top side, a bottom side, a front side, a rear side, and two lateral sides, said housing comprising:

an upper plate forming said top side;

a plurality of vertical members attached to said upper plate;

a lower plate attached to said vertical members for forming said bottom side;

a front side plate attached between said upper plate and said lower plate for forming said front side;

a rear side plate attached between said upper plate and said lower plate for forming said rear side; and both of said two lateral sides comprising:

two main lateral side plates each attached between said upper plate and said lower plate, each of said two main lateral plates being adjacent to different ones of said front side and said rear side of said housing, said two main lateral side plates each having a male connector extending along one entire edge of each one of said two main lateral side plates in a direction perpendicular to said upper plate and said lower plate, said male connector being centrally located along said entire edge and spaced apart from front and rear faces of said main lateral side plates;

said male connector being rectangularly shaped with a U-shaped tapered end;

an auxiliary lateral side plate positioned between said two main lateral side plates, said auxiliary lateral side plate having a female connector extending along two entire lateral edges in a direction perpendicular to said upper plate and said lower plate for retentively engaging said male connector in each of said two main lateral side plates, said female connector being centrally located along said entire edge and spaced apart from front and rear faces of said auxiliary side plate;

said female connector having a rectangularly shaped cavity tapered to a U-shaped end and two side walls of the female connector tapered to U-shaped ends;

said female connector having a thickness less than said auxiliary plate; and a length, width and thickness of said male connector corresponding to the cavity of said female connector.

9. The housing of claim 8, further comprised of said housing supporting and enclosing a plurality of electronic equipment.

10. The housing of claim 8, further comprised of said female connector along two edges of said auxiliary lateral plate being a concave slot.

11. The housing of claim 10, further comprised of said male connector along one side of each of said two main lateral side plates being a protrusion for retentively engaging said concave slot along said auxiliary plate.

12. The housing of claim 8, further comprised of said main lateral side plates connected to said vertical members using a side support having one end connected to an interior side of said vertical member using a fastening means, and the other end of said side support connected to said main lateral side plate using a fastening means positioned on said main lateral side plate.

13. The housing of claim 8, further comprised of said main lateral side plates having electronic equipment connectors integrally formed as a unitary piece composed of a hollow tube connected vertically to said main lateral side plates and connected to the hollow tube are dual hooks facing each other in a U-shape.

14. The housing of claim 8, said auxiliary lateral side plate flush with said two main lateral side plates.

* * * * *